United States Patent
Tsuji et al.

[11] Patent Number: 6,068,699
[45] Date of Patent: May 30, 2000

[54] APPARATUS FOR FABRICATING SEMICONDUCTOR SINGLE CRYSTAL

[75] Inventors: Hideki Tsuji, Yamato; Mitsunori Kawabata; Yoshinobu Hiraishi, both of Omura, all of Japan

[73] Assignee: Komatsu Electronic Metals Co., Ltd., Kanagawa, Japan

[21] Appl. No.: 08/702,840

[22] Filed: Aug. 26, 1996

[51] Int. Cl.[7] .................................................. C30B 15/28
[52] U.S. Cl. ........................ 117/201; 117/202; 117/208; 117/218
[58] Field of Search ................ 117/14, 15, 218, 117/201, 202, 208

[56] References Cited

U.S. PATENT DOCUMENTS

| | | | |
|---|---|---|---|
| 3,194,637 | 7/1965 | Longini et al. | 117/218 |
| 4,352,785 | 10/1982 | Schellin | 117/218 |
| 4,367,199 | 1/1983 | Jericho | 117/218 |
| 5,106,593 | 4/1992 | Mizuishi et al. | 117/218 |

FOREIGN PATENT DOCUMENTS

| | | | |
|---|---|---|---|
| 62-241890 | 10/1987 | Japan | 117/15 |
| 2078188 | 1/1982 | United Kingdom | 117/218 |

*Primary Examiner*—Robert Kunemund
*Attorney, Agent, or Firm*—Welsh & Katz, Ltd.

[57] ABSTRACT

The present invention utilizes a weighing detector as well as a weighing diameter-controlling method in a crystal-pulling apparatus using a wire method for measuring the crystal weight in accuracy. A pulling wire 4 and a wire rolling means 20, having a wire rolling drum 21, suspended on a weighing detector 2 in a freely rotating way. Accordingly, in the weighing detector 2, the weights of the pulling wire 4 and the wire rolling means 20 are served to balance the loading weight. In addition, the vertical central line 6 of the weighing detector, the rotating axis of the wire rolling drum 21, the rotating axis of the wire rolling means 20, and the axis of pulling crystals are all consistent. Consequently, the whole gravity center is located on the vertical central line of the weighing detector 2. When pulling the single crystals at the same time as rolling the wire, the gravity center of the wire rolling means is shifted merely depending on the diameter variation at the pulling wire. Therefore, the deviation of the single crystal-pulling axis while rolling the wire rolling means can be decreased. Therefore, it is possible to pull single crystals as well as weigh in a stable manner.

3 Claims, 3 Drawing Sheets

36: MOTOR FOR DRIVING THE ROLLING DRUM 21

APPARATUS FOR FABRICATING SEMICONDUCTOR SINGLE CRYSTAL

BACKGROUND OF THE INVENTION

1. Field of the Invention

The present invention generally relates to an apparatus for fabricating semiconductor single crystals by a weighing method to control their diameters.

2. Description of the Related Art

At present, most of semiconductor substrates used for fabricating integrated circuits are single crystals of silicon with high purity. However, a substantial percentage of the silicon crystals used by the semiconductor industry are prepared by the Czochralski technique, CZ thereafter. In the CZ crystal-growth process, polycrystalline silicon with high purity is first loaded into a crucible, which is placed in the furnace of a manufacturing apparatus, as a raw material. A main heater around the crucible is utilized to heat the polycrystalline silicon above its melting point. Moreover, a suitably oriented seed crystal is suspended over the crucible in a seed holder, and thereafter is inserted into the melt. It is then slowly withdrawn and rotated in a direction the same as or counter to that of the crucible rotation. Progressive freezing at the solid-liquid interface yields a large, single silicon crystal.

FIG. 4 depicts a conventional apparatus for fabricating semiconductor single crystals in a schematic diagram. Numeral 21 is a wire-rolling drum. Numeral 31 designates a motor for driving the rolling drum 21. Numeral 36 represents a motor for driving the rolling drum 21 and the vacuum container 1 having the driving motor 31 placed thereon to move in a horizontal direction. Thus, pulling the rotating wire 4 rotates grown single crystals. Numeral 37 is a camera, and numeral 38 is a transparent quartz window. Numeral 39 is a seed holder to suspend a seed crystal. Furthermore, numeral 40 represents the melt surface, numeral 41 is a graphite heater for melting polysilicon loaded in the crucible, numeral 42 is a graphite thermal shield, numeral 43 designates a motor for rotating the crucible through a crucible shaft, and numeral 44 designates a motor for moving the crucible up and down. When pulling the single crystals of silicon, the camera 37 takes the image signals of meniscus on the melt-crystal interface and then sends to a camera control unit 45. Then, the image signals inputted to a width-detecting unit 46 allow measurement of the diameter of the grown crystal. Accordingly, the pull-rate mechanism and the heater 41 is slaved to the output of a diameter control means 47 so as to readily control the ingot diameters to a predetermined size. Moreover, numeral 48 is a monitor.

However, in addition to applying the aforementioned wire method to the crystal-pulling apparatus by using an optical system (e.g., the camera 37) to control the diameter of single crystals, a weighing control method is available. According to the weighing control method, a standard crystal weight is utilized to compare with that of the grown single crystal then to adjust the pull-rate and the temperature within the furnace. Accordingly, the single crystal is grown to a diameter approaching to that of the standard crystal. Intuitively, the weighing control method must measure the weight of the grown crystal with high accuracy. Therefore, a rod-shape device, so-called an force-bar, must be suspended at the weight-exerting point. Then, the seed crystal is mounted at the bottom end of the force-bar, and the weight of the grown single crystals can be subjected to the weighing detector. However, if the fabricated crystal ingots are provided with the same length as that of the wire method, the apparatus based on the weighing control method will have a total height 1.5–2 times greater than that of the apparatus by using the wire method. This means the factory equipped with the apparatus utilizing the weighing control method need greater space to dispose said apparatus. Consequently, the manufacture cost using the weighing control method is higher as compared with that of the wire method. Nevertheless, the weighing control method does demonstrate several superb diameter-controlling characteristics, such as excellent reproduction and controllable tails. Therefore, the weighing diameter-controlling method is preferable for fabricating semiconductor crystal over the wire method.

The apparatus for pulling crystals by the wire method is disclosed in Japanese Patent Publication No. 04-89389. While the weighing diameter-controlling method applied to this pulling apparatus, as schematically depicted in FIG. 5, the wire 4 for pulling single crystals is rolled via a guide pulley 27 by the rolling drum 21. Such a structure allows the weighing detector 2 to measure the weight W of the single crystal subjected to the guide pulley 27. However, in the structure as depicted in FIG. 5, the force, that is W+F, subjected to the weighing detector 2 comprises the weight of the crystal accompanying with a pulling force F larger than the crystal weight W. Accordingly, the utilized weight detector should be provided with an ability to tolerate a loading two times heavier than the grown crystal weight. However, a novel weighing detector that can sustain heavy loading results in the problem of increasing manufacturing costs.

According to another way, the pulling wire 4 is pliable, and is formed by twisting of a plurality of metal filaments. The twisted structure makes the wire 4 non-circular in cross-sectional view, but makes the diameter in periodic variation along with its axis. As depicted in FIG. 5, the loading point variation in the crystal weights results from the diameter variation, and torque variation of the rolling drum 21 for pulling the crystals affects the crystal pulling force F, or the detecting value W+F, measured by the weighing detector, producing inaccuracy.

Therefore, the error involved in the weighing signal as measured from the weighing detector can not accurately control the diameter of grown single crystal and high quality crystals are difficult to obtain.

SUMMARY OF THE INVENTION

Accordingly, it is an object of the present invention to provide an apparatus for fabricating single crystals of semiconductor, characterized in that the weighing diameter-controlling method used by the weighing detector is utilized in an apparatus for pulling crystals by the wire method. Thus, the diameter of the crystals are well controlled by measuring the single crystal accurately.

The present invention achieves the above-identified object by providing an apparatus for fabricating semiconductor single crystals, comprising a pulling wire for transmitting rotation and movement to the grown single crystal, a wire rolling means, and a rotating means for rotating the wire rolling means by using the axis of pulling single crystals as its rotating axis. For controlling the crystal diameter in the apparatus according to the present invention, the loading point of the weighing detector suspends the wire rolling means in a freely rotation way. Such a structure makes the vertical central line of the weighing detector, the rotating axis of the wire rolling drum, the rotating axis of the wire rolling means, and the axis of pulling crystal all consistent. In a word, the overall gravity center is positioned on the vertical central axis of the weighing detector.

The pulling wire made of twisted metal filaments reveals non-uniform diameter on account of twisted spacings. Therefore, when the wire is rolled, through the guide pulley, by the rolling drum, the rotation center of the guide pulley merely generates a minor variation with the center of the pulling wire (the crystal-pulling point) which is the contact point contacting with the guide pulley. However, when the wire rolling means is provided with another fulcrum in addition to the loading point of the weighing detector, the crystal weight applied to the crystal-pulling point and the exertion point positioned at the weighing detector form a torque to attain a balance state and then measure crystal weights. Accordingly, the variation of the crystal-pulling point acts as the variation of the crystal weight. Therefore, if the fulcrum of the wire rolling means is confined to the loading point of the weighing detector, the whole weight of the wire rolling means and the crystal weight are balanced with the loading weight at the weighing point of the weighing detector In accordance with the present invention, on account of that the pulling wire and the wire rolling means hang from the crystal fabrication apparatus in a free-rotation way, the weights of the grown single crystal and the wire rolling means are subjected to the weighing detector, respectively. By varying the crystal-pulling point, for example, based on the growth of the single crystals and the twist of the pulling wire, the gravity center of the wire rolling means is movable. However, because the wire rolling means is hanged from the apparatus for fabricating single crystals of semiconductor and such an integration portion is used as a center, the straight line connecting the gravity centers of the integration portion and the wire rolling means is aligned with the direction of the gravity center toward the center of the means. Accordingly, in the weighing detector the weight of the wire rolling means, including the crystal weight, do not serve to balance the torque appeared on the apparatus for fabricating single crystals of semiconductor, but serve to balance the loading weight. Consequently, the weight of the wire rolling means, that is the crystal weight, can be measured accurately.

Moreover, because the wire rolling means having a motor for rolling the wire is suspended from the weighing detector, the torque variation generated by the motor and the wire friction will less affect the means.

Furthermore, by means of the rotatively grown single crystals, the effects of the centrifugal force of the wire rolling means can be eliminated. In addition, the vertical central line of the weighing detector, the rotating axis of the wire rolling drum, the rotating axis of the wire rolling means, and the axis of pulling crystals are all consistent. When pulling the single crystals accompanying with rolling the wire, the gravity center of the wire rolling means is shifted merely depending on the diameter variation at the pulling wire. Therefore, the deviation of the single crystal-pulling axis while rolling the wire rolling means can be decreased. Consequently, it is possible to pull single crystals as well as weigh them in a stable manner.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Figure 1:
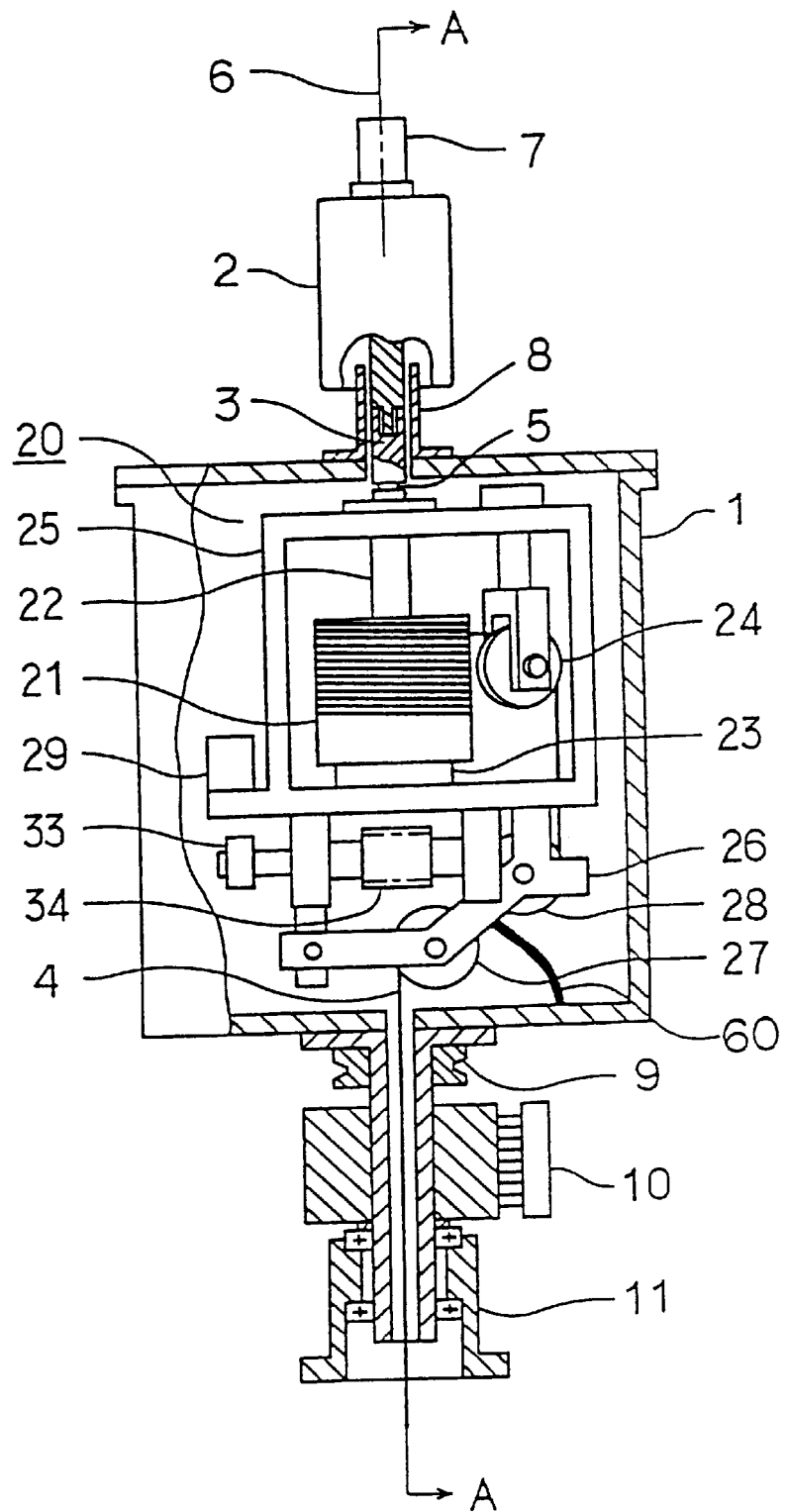
FIG. 1 schematically depicts the partial diagram of a crystal pulling means of an apparatus for fabricating single crystals of semiconductor in a cross-sectional view.

Referring to FIG. 1, an apparatus for fabricating semiconductor single crystals, according to the present invention, is depicted in partial cross-sectional view. A weighing detector 2 for diameter-controlling is installed on the top portion of an vacuum container 1. A force-bar 3 is threaded on the bottom portion of the weighing detector 2 so as to extend the apparatus for fabricating single crystals of semiconductor in a downward direction. The force-bar 3 via the integration device 5 suspends a wire rolling means 20 and a pulling wire 4, both of which are disposed in the vacuum container 1.

Reference numeral 21 designates a wire rolling drum, numeral 22 is a splined shaft, numeral 23 is a threaded shaft, and reference numeral 24 represents a third guide pulley, all of which are contained in a frame 25. The wire rolling means 20 is arranged to align the rolling axis of the wire rolling drum 21 with the vertical central line of the weighing detector 2. A first guide pulley 27 and the second guide pulley 28 are pivoted on an arm 26 of the frame 25. The first guide pulley 27 is used to adjust the wire 4 aligned with the central line 6, and, therefore, the pulling wire 4 is guided in such a way from the first guide pulley 27 to the second guide pulley 28. Then, the wire 4 is vertically pulled via the second guide pulley 28, and rolled through the third guide pulley 24 by the wire rolling drum 21. Numeral 29 designates the balance weight for adjusting the wire rolling means 20 on the central line 6 of the weighing detector 2. However, the rotating axis of the wire rolling drum 21 is consistent with the axis for pulling single crystals. Therefore, the weight of the grown single crystal can be subjected, through the pulling wire 4, directly to the weighing detector 2 and measured thereby. Numeral 7 designates a slip ring used to the weighing detector 2 for providing electric power and output signals therethrough. Numeral 8 is an adjuster which makes the vertical central line 6 consistent with the rotating axis of the vacuum container 1. Reference numeral 9 represents a pulley for rotating the vacuum container 1. The required electric power of the motor for rotating the rolling drum 21 is supplied by a cable 60, extending along the inner of the vacuum container 1, and by the slip ring and the brush of the means 10. Moreover, the vacuum container 1 and the wire rolling means 20 are synchronically rotated, and relatively static. The wire rolling means 20 is not affected by the cable 60 because the cable 60 has no tension. Reference numeral 11 designates a support bearing unit allowing the apparatus for pulling single crystals to rotate freely. When the furnace is operated in a de-pressure mode, the support bearing unit 11 is sealed up by oil seal or magnetic fluid seal.

Figure 2:
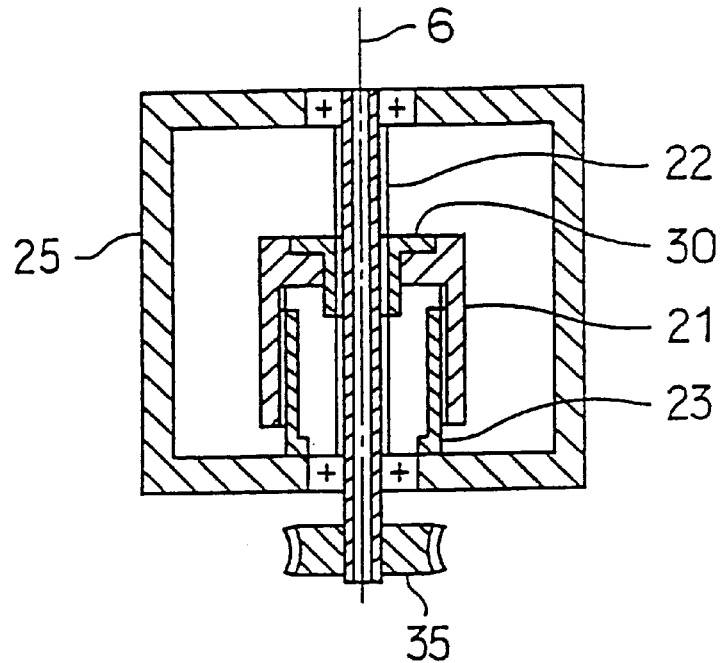
FIG. 2 depicts cross-section diagram of the wire rolling drum cut along a line A—A as illustrated in FIG. 1.
Figure 3:
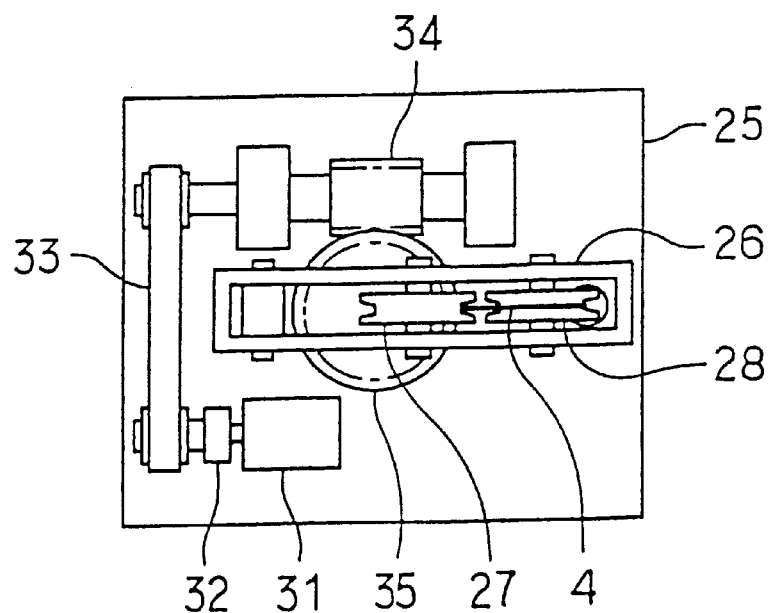
FIG. 3 depicts a bottom view diagram of the vacuum container interior.
Figure 4:
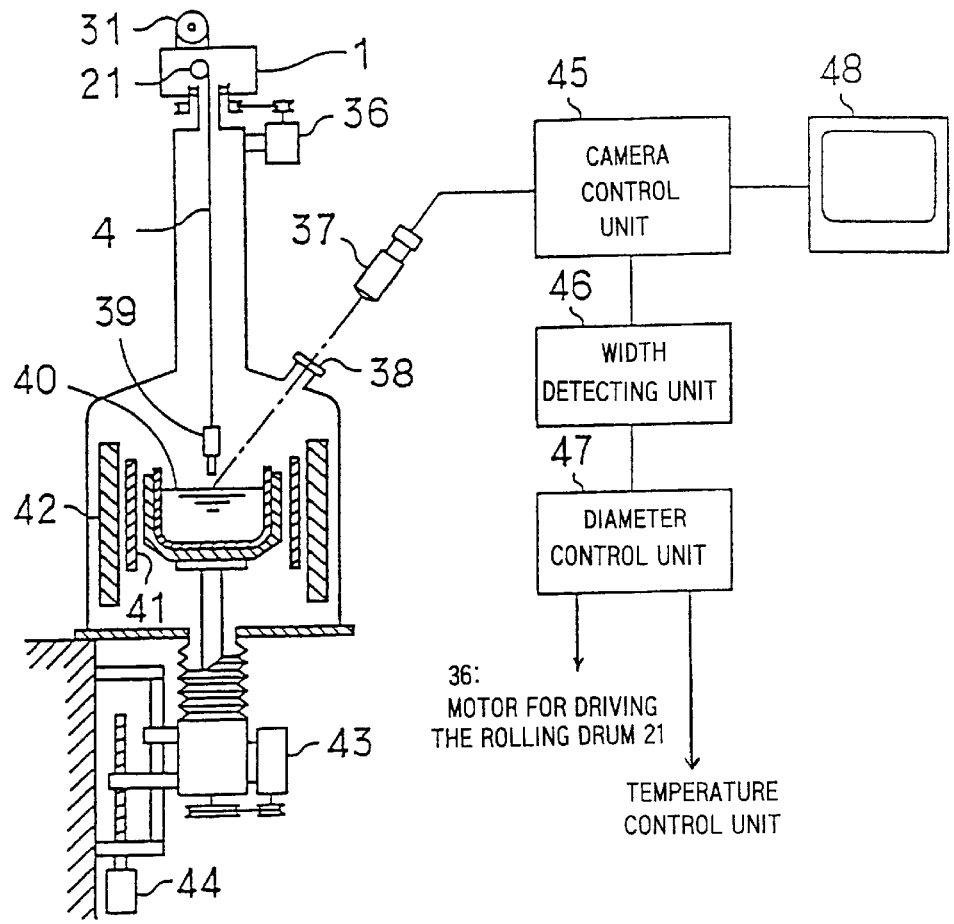
FIG. 4 schematically depicts conventional apparatus for fabricating semiconductor single crystals by using the optical diameter-controlling method.
Figure 5:
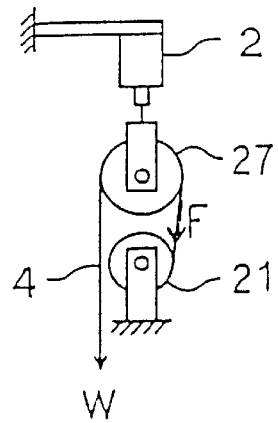
FIG. 5 schematically depicts the installation diagram of the weighing detector of the crystal pulling means by using the wire method.

Referring to FIG. 2, the cross-sectional view of the periphery of the wire rolling drum cut along the A—A line is schematically depicted. FIG. 3 schematically depicts the bottom plane view of the vacuum container. The wire rolling drum 21 is provided with a splined nut 30 inlaid in the splined shaft 22 and threaded on the threaded shaft 23 by its outer periphery. The two ends of the splined shaft 22 are supported by bearings inlaid in the frame 25. The bottom end of the threaded shaft 23 is mounted on the frame 25. The motor 31 disposed at the bottom portion of the frame 25 drives, through a coupling 32, a belt 33, a worm 34, and a worm wheel 35, the splined shaft 22 so as to rotate the wire rolling drum 21.

The outer periphery of the wire rolling drum 21 has spiral trenches to roll the wire 4 by a predetermined pitch P. When the wire rolling drum 21 is rotated to pull single crystals in a constant direction, the wire 4 is rolled. Meanwhile, the screw nut deposed on the inner surface of the wire rolling drum 21, having the same pitch as that of the outer periphery of the wire rolling drum 21, is threaded on the screw of the threaded shaft 23 and ratable thereby. In such a way, the apparatus for fabricating single crystals is moved along the axis direction of the shaft which can prevent the overlapping of the wire 4 while rolling. Moreover, the position of the wire 4 between the crystal-pulling apparatus and the third pulley 24 is kept constant.

In addition, the wire rolling means 20 can be reversed and suspended on the force-bar 3. At that time, the vertical central line 6 of the weighing detector 2, the rotating axis of the apparatus for fabricating single crystals, the axis of pulling single crystals are all consistent, and, therefore, the pulling wire 4 passes through the axle center of the hollow splined shaft 22.

The pulling single crystal apparatus, in accordance with the present invention, installed in the conventional single-crystal fabrication apparatus utilizing wire method is described above. In addition, the weighing diameter-controlling means utilized in a force-bar fabrication apparatus is involved in the single-crystal fabrication apparatus therefore to fabricate single crystals. Accordingly, the present invention achieves the same accuracy in diameter control. Moreover, the present invention can continuously control the shoulder portion and tail portion in diameter, while the optical diameter-controlling method has difficulty in doing so.

In conclusion, the apparatus for fabricating semiconductor single crystals utilizing a wire method, in accordance with the present invention, comprises a wire rolling means for pulling a wire, all of which is suspended on the bottom portion of the single-crystal fabrication apparatus. Accordingly, the vertical central line of the weighing detector, the rotating axis of the wire rolling drum, the rotating axis of the wire rolling means, and the axis for pulling the single crystals are all consistent. Therefore, the effects of the rotation of the wire rolling means can be ignored while pulling single crystals. Moreover, because the weight of the wire rolling means including the crystal weight is balanced at the weighing detector, the weight of the single crystals can be measured accurately. Thus, both of the weighing detector and the diameter-controlling means used in the force-bar single-crystal fabrication apparatus are suitable for the fabrication apparatus using the wire method so as to decrease the manufacturing cost. Consequently, the present invention implements a single-crystal fabrication apparatus that demonstrates good diameter control and low-cost.

Alternative embodiments of the invention have now been described in detail. It is to be noted, however, that this description of these embodiments is also illustrative of the principles underlying the inventive concept. It is therefore contemplated that various modifications of the disclosed embodiments will, without departing from the spirit and scope of the invention, be apparent to persons of ordinary skill in the art, and the scope of the invention is intended to be limited only by the appended claims.

What is claimed is:

1. An apparatus for fabricating single crystals of semiconductor, comprising: a pulling wire for transmitting rotation and movement to a single crystal, a wire rolling means, and a rotating means for rotating the wire rolling means with respect to an axis of pulling the single crystal as a rotation axis;

wherein the wire rolling means is suspended on a loading point of a weighing detector for weighing the single crystal so as to control a diameter of the single crystal.

2. The apparatus as claimed in claim 1, wherein a vertical central line of the weighing detector, the rotating axis of the wire rolling means, and the axis of pulling the single crystal are all consistent together, which means that a gravity center of the whole weight is positioned on the vertical central line.

3. The apparatus as claimed in claim 2, wherein a rotation axis of a wire rolling drum is parallel to or consistent with the vertical central line of the weighing detector.

* * * * *